(12) United States Patent
Rydin

(10) Patent No.: US 6,727,750 B1
(45) Date of Patent: Apr. 27, 2004

(54) AMPLIFIER STABLILIZATION

(75) Inventor: Arne Rydin, Fjärdhundra (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 538 days.

(21) Appl. No.: 09/697,475

(22) Filed: Oct. 27, 2000

(30) Foreign Application Priority Data

Oct. 29, 1999 (SE) .............................................. 9903917

(51) Int. Cl.[7] ................................................ H03F 1/00
(52) U.S. Cl. ...................... 330/151; 330/107; 375/297; 455/63
(58) Field of Search ................................ 330/151, 107, 330/149; 455/63; 375/297

(56) References Cited

U.S. PATENT DOCUMENTS

| | | |
|---|---|---|
| 5,420,536 A | 5/1995 | Faulkner et al. |
| 5,818,298 A | 10/1998 | Dent et al. |
| 6,351,677 B1 * | 2/2002 | Leyonhjelm et al. ......... 700/44 |
| 6,359,508 B1 * | 3/2002 | Mucenieks ................... 330/149 |

FOREIGN PATENT DOCUMENTS

WO        99/23756        5/1999

* cited by examiner

Primary Examiner—Henry Choe
(74) Attorney, Agent, or Firm—Nixon & Vanderhye

(57) ABSTRACT

The present invention relates generally to the problem of linearization in electronic amplifiers, and more particularly to the problem of controlling phase shift in these systems. The invention measures the outgoing phase difference, directly or indirectly, and then rotates the Cartesian system accordingly to adjust the phase error in the system to within a few degrees. The phase difference can be measured in different places in the system as can the performance of the Cartesian rotation. The rotation is necessary to make the system unconditionally stable independent of the phase difference between the main amplifier path and the reference path. The invention achieves stabilization of the phase in a power amplifier, thereby eliminating the need for time-consuming adjustments and also allows the achievement of higher bandwidths since the phase control is very accurate.

22 Claims, 7 Drawing Sheets

AMPLIFIER STABLILIZATION

FIELD OF THE INVENTION

The present invention relates generally to the problem of linearisation in electronic amplifiers, and more particularly to the problem of controlling phase shift in these systems.

RELATED ART

The demand for mobile radio telephone services has been increasing in recent years and has resulted in searches for ever more efficient modulation schemes. The most efficient forms of radio frequency ("RF") modulation schemes are non-linear, e.g. Gaussian Minimum Shift Keying ("GMSK"). However, demands for extra capacity have led to research into linear modulation solutions, e.g. n/4 Shift DQPSK.

Linear modulation schemes produce greater gains in spectrum utlisation at the expense of variations in the envelope. These signals will undergo distortion when passed through non-linear RF amplifiers which results in a spreading of the spectrum beyond the allocated channel and the production of intermodulation products. Thus it is desirable to have a linear RF amplifier for linear modulated systems. However, conventional linear amplifiers are also inefficient, implying that there is also a need for linear amplifiers being power efficient so as to be able to power them using the batteries in mobile telephones.

It is known to use feed-forward linearisation as one method of linearising non-linear amplifiers. It is based on cancelling the distortion of the amplifier at the output. The distortion signal, or error signal, is measured by comparing the amplifier output signal with the input. This error signal is out of phase with the distortion and is applied to the output, thereby resulting in a reduction in the distortion. The error signal needs to be amplified by a linear RF power amplifier.

However, as the efficiency of an RF power amplifier increases so does its distortion, and hence the error signal level to be amplified. The larger the error signal the larger the linear amplifier and hence the greater the power consumption and the lower the efficiency. Such systems have been applied particularly for wideband systems. In short, an example of a feed-forward linearisation system may have two loops of which a first loop includes a main amplifier path that needs to have the same gain and phase shift as a reference path in order to subtract distortion created in the main power amplifier. The same applies to a second loop where an error amplifier path needs to have the same gain and phase shift as the main path so that the error can be subtracted from the error contained in the main power amplifier signal.

It is possible to achieve the control mentioned above in either the polar or the Cartesian domain. According to one method the phase and gain are controlled in the polar domain. According to another method the control is performed in the Cartesian domain where the gain and phase are controlled with the help of orthogonal vectors. Both of these methods have their particular advantages and disadvantages. A particular disadvantage of the Cartesian system is its lack of stability.

It is also known to use feedback to linearise non-linear systems. One method is to use Cartesian feedback, which uses negative feedback of the baseband quadrature modulation to provide reduction in intermodulation distortion with low complexity and cost. Cartesian gain and phase control is described in U.S. Pat. No. 5,157,346. The solution described in this patent still suffers from the stability problem. The reason for this is that the phase shift in the amplifier path and the reference path have to be equal to within at least 90 degrees or the system will be unstable. Even so, a phase error of a few degrees will still severely degrade the performance of the system. This means that a careful adjustment is needed, but temperature and ageing effects can limit the performance and even bring the system into oscillation.

Accordingly it can be seen that there still exists a need to provide linearisation of power amplifiers by using feedback in the Cartesian domain that can hold the phase error stable to within a few degrees.

SUMMARY OF THE INVENTION

As can be seen above, there still exists a problem in systems for linearisation of power amplifiers, and especially in systems which use Cartesian feedback techniques for linearisation. Present systems suffer from the problem that their phase is unstable, which leads to severe system degradation.

Accordingly, it is an object of the present invention to provide a method and apparatus for Cartesian feedback to stabilise the phase error of an amplifier to within a few degrees.

The present invention achieves the above objectives by automatically controlling the phase in a system. Feedback systems commonly have an operational amplifier. An internally compensated operational amplifier is approximately an integrator giving 90 degrees of phase shift so an additional phase shift of another 90 degrees will make the amplifier oscillate; even phase shifts in excess of approximately 30 degrees will deteriorate the performance with gain and noise peaking. If you introduce a delay or a phase shift in a loop with the operational amplifier the system is not necessarily stable. In radio technology these delays can be e.g. up- and down-converters or a power amplifier. In order to make the system stable, a corresponding phase shift has to be subtracted somewhere in the closed loop. A rotation is necessary to maintain stability under all conditions, although this can, at least in theory, be made manually by careful trimming. Typically the phase shift is several turns in a transmitter, say 20 times 360 degrees, and has to be controlled within say +–30 degrees.

The present invention automatically controls the phase in a system by measuring the phase difference, directly or indirectly, and then performing a rotation on the Cartesian system accordingly to adjust the phase error within a few degrees.

There are several ways to measure the phase difference. The most straightforward way is to measure the outgoing phase of the Cartesian phase and gain control element and compare this with the phase of the reference signal. Alternatively, it is possible to indirectly measure the outgoing phase by using the control signals to the gain and phase controller as a measure of the outgoing phase. This phase is then subtracted from the phase of the reference signal obtained with a Cartesian phase detector and the phase difference is used to rotate the co-ordinates.

The co-ordinate rotation can be performed at several places in the system. The rotation can be done in RF somewhere in the main amplifier path or the control signals to the gain and phase controller can be rotated. Other possibilities are phase rotation of reference signal, rotation of the signal from the main amplifier going to the summation point or rotation of the error signal.

The present invention is superior to all other methods of making this form of Cartesian loops stable and eliminates the need for cumbersome and time-consuming adjustment. Further, since the phase control is very accurate, this invention can give higher bandwidth and overall performance than any existing solutions.

Although the invention has been summarised above, the method and the system according to the invention are defined in the appended claims.

BRIEF DESCRIPTION OF THE DRAWINGS

The present invention will now be described in more detail with reference to preferred embodiments of the present invention, given only by way of example, and illustrated in the accompanying in drawings, in which.

DETAILED DESCRIPTION

Figure 1:
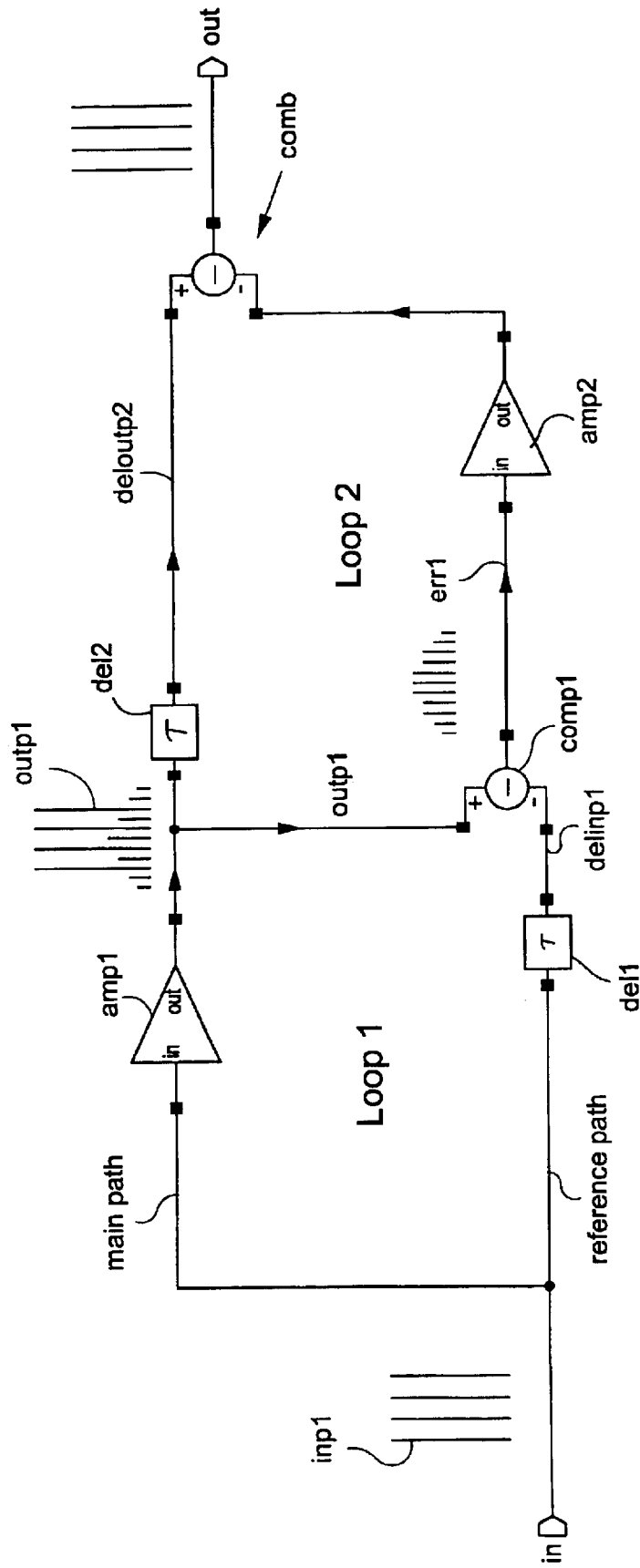
FIG. 1 is a diagram of a feedforward linearisation system as known in the prior art.

The prior art feed-forward linearisation system according to FIG. 1 comprises a comparison loop, designated LOOP1, in which a main amplifier amp1 in a main path extends in parallel with a reference path including a delay line del1. The main and reference paths each receive an input signal inp1. In response to the input signal inp1 the amplifier amp1 produces a distorted output signal outp1. The reference path with the delay line del1 introduces a delay substantially equal to that of the amplifier amp1 to produce a delayed input1 delinp1. A comparator comp1 receives the signals outp1 and delinp1 and produces at its output an error signal err1 representative of the difference between the signals outp1 and delinp1. If the comparison loop LOOP1 is balanced, the error signal err1 is representative of distortion produced by the amplifier amp1.

In a second loop, LOOP2, the error signal err1 is fed via amplitude and phase matching networks, not shown, to an error amplifier amp2 and thence to a first input of a combiner comb. The output outp1 of the amplifier amp1 is also fed to a second input of the combiner comb via a delay line del2 introducing a delay substantially equal to that introduced by comparator comp1 and the above mentioned amplitude and phase matching networks.

Thus, in LOOP1 the main amplifier amp1 path fulfills the need to have the same gain and phase shift as a reference path in order to subtract the distortion created in the main power amplifier amp1. The same applies to the LOOP2 where the error amplifier path fulfills the need to have the same gain and phase shift as the main path so that the error can be subtracted from the error contained in the main power amplifier signal.

Figure 2:
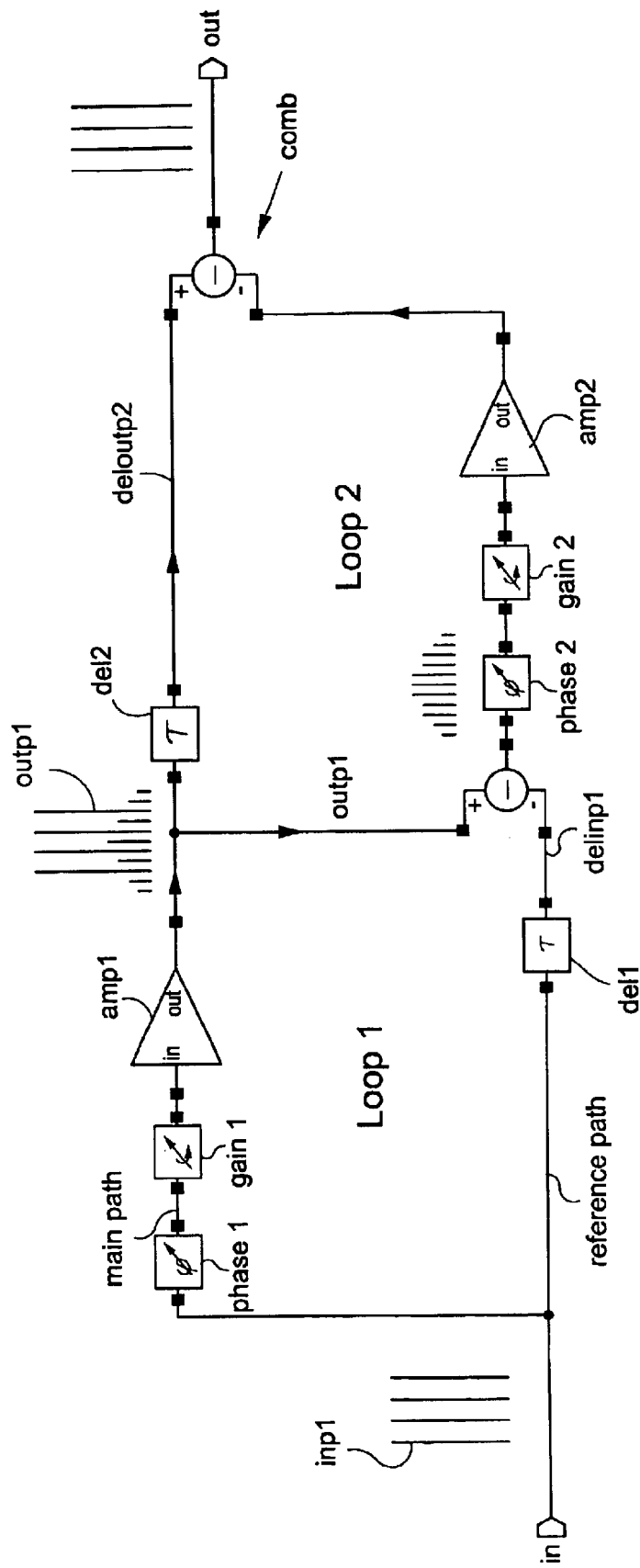
FIG. 2 is a diagram of a prior art feedforward linearisation system where the phase and gain are controlled in the polar domain.

It is possible to achieve the control mentioned above in either the polar or the Cartesian domain. One method for control of phase and gain is roughly indicated by FIG. 2. FIG. 2 differs from FIG. 1 only by a phase control element phase1 and a gain control element gain1 having been introduced in series with the input of the amplifier amp1, and a phase control element phase2 and a gain control element gain2 having been introduced in series with the input of the amplifier amp2.

Another prior art method for control in the Cartesian domain of gain and phase is roughly indicated in FIG. 3, that differs from FIG. 1 in the following respects. The input signal inp1 is coupled to the main amplifier amp2 via a control circuit including, in series, a 90-degree phase splitter and a Cartesian phase and gain control element. The 90-degree phase splitter receives the signal inp1 and splits it into two orthogonal components 0 and –90 received by the Cartesian phase and gain control element. The Cartesian phase and gain control element 4 is controlled by control signals I and Q. An arrangement similar to the above mentioned control circuit is also introduced before the amplifier amp2.

Figure 3:
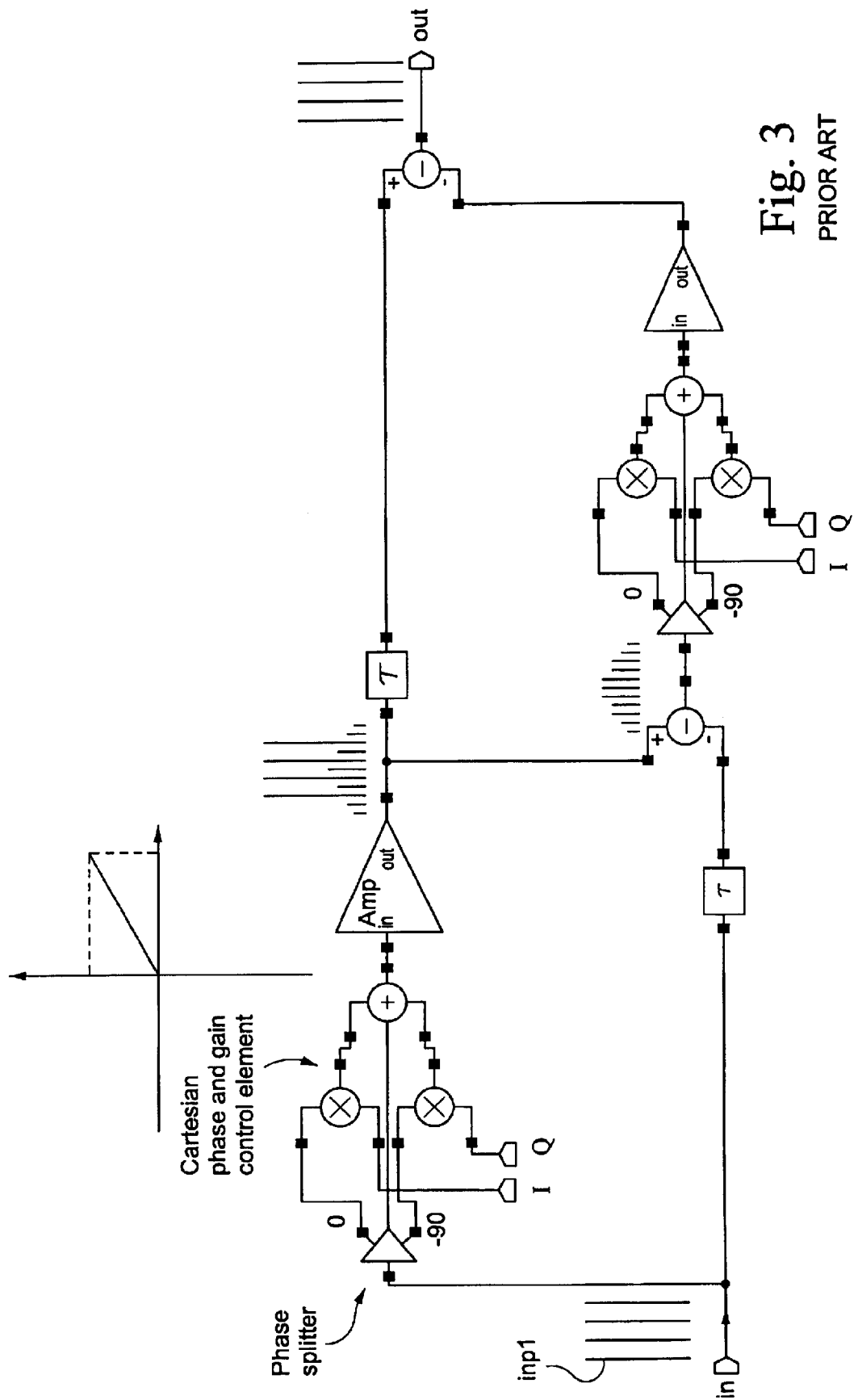
FIG. 3 is a diagram of a prior art feedforward linearisation system where the phase and gain are controlled in the Cartesian domain.

Both of the above methods acording to FIGS. 2 and 3 have their particular advantages and disadvantages. A particular disadvantage of the Cartesian system is its lack of stability.

Figure 4:
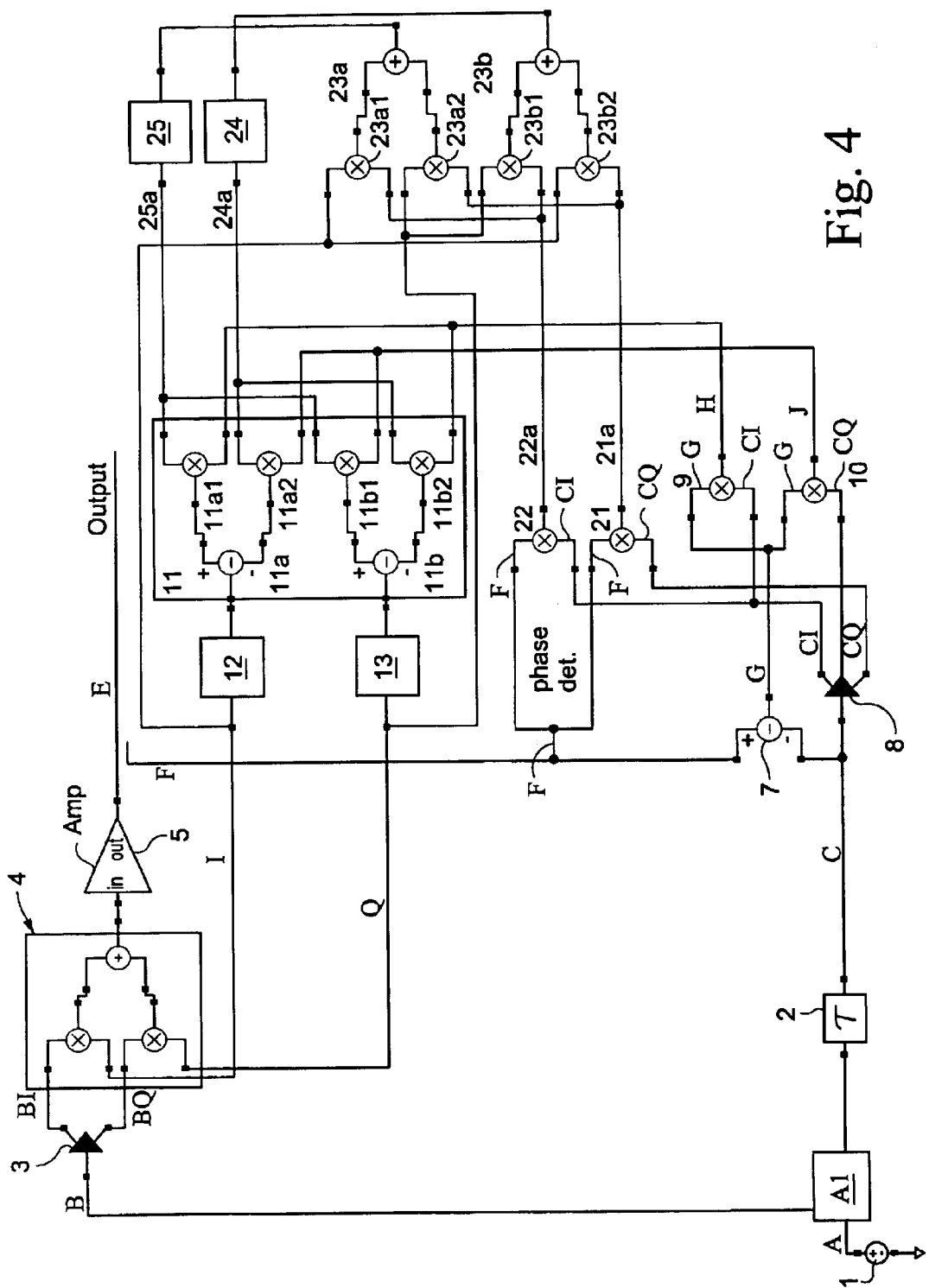
FIGS. 4–7 illustrate diagrams of different embodiments according to the present invention providing feedforward linearisation systems with phase and gain controlled in the Cartesian domain.

An embodiment of the present invention is shown in FIG. 4 in the form of a feedforward linearisation system being phase and gain controlled in the Cartesian domain. An input signal A from a signal source 1 is split into signals B and C by a signal splitter A1. Signal C is delayed by a delay line 2 for use as a reference signal, as will also be described more closely below. Signal B is coupled to a main amplifier path including, in series, a 90-degree phase splitter 3, a Cartesian phase and control element 4 and a main amplifier 5. The 90-degree phase splitter 3 receives signal B and splits it into two orthogonal components BI and BQ received by the Cartesian phase and gain control element 4. The output of the control element 4 is fed to the main amplifier 5 that produces an output signal E. A fraction F of the main amplifier output signal E and the delayed signal C are fed to a subtracting circuit 7 that generates a difference G of signal E and the reference signal C.

Reference vectors CI, CQ in the form of orthogonal components of the reference signal C are generated in a 90-degree phase splitter 8. The orthogonal components CI and CQ are fed to a first input of each a correlator 9 and 10, respectively, which also receive the signal G on a respective second input. The correlators 9 and 10 in their simplest form may be multipliers and perform correlation of the signal G with the orthogonal components CI and CQ for producing error vectors H and J. The orthogonal error vectors H and J are received in a rotator 11 for rotation therein and then control the Cartesian phase and gain element 4 via loop filters 12 and 13 as will be described more closely below. Thereby a control loop is closed.

The rotation of the error vectors H and J makes the system unconditionally stable, independent of the phase difference between the main amplifier path B and bye reference path C. In the present invention this is accomplished by measuring the phase shift of the loop containing the main amplifier 5, either directly or indirectly, and this information is then used to rotate the co-ordinate system accordingly.

According to one embodiment the transmitted phase, being the phase between the Cartesian gain and phase controller 4 and the input of amplifier 5, may be indirectly determined by utilising the control signals Q and I for the gain and phase controller 4. The received phase, being the phase at the input of the signal F at the subtracting circuit 7, is obtained by projecting the signal F on the reference vectors CI and CQ. This is performed in phase detectors 21, 22 which receive the signal F on each a first input and each one of the reference vectors CI and CQ on each a second input. Outputs 21a and 22a from the phase detectors 21 and 22, respectively, are fed to a phase subtracter 23 in which the difference between the transmitted and the received phase is calculated.

More particularly, the phase subtractor 23 comprises two groups 23a and 23b of each two phase detectors 23a1, 23a2 and 23b1, 23b2, respectively. The phase detectors 23a1 and 23b1 on one input each receive output 22a from the phase detector 22. The phase detectors 23a2 and 23b2 on one input each receive output 21a from the phase detector 21. The respective second inputs of phase detectors 23a1 and 23b2 are together connected to an output of the loop filter 12. The respective second inputs of phase detectors 23a2 and 23b2 are together connected to an output of the loop filter 13.

Outputs of phase detectors 23a1 and 23a2 are added to form an input to a loop filter 25, the output of which forms a first input to the rotator 11. Outputs of phase detectors 23b1 and 23b2 are subtracted to form an input to a loop filter 24, the output of which forms a second input to the rotator 11.

More particularly, the rotator 11 comprises two groups 11a and 11b of each two multipliers 11a1, 11a2 and 11b1, 11b2, respectively. The multipliers 11a1 and 11b1 on one input each receive output 25a from the loop filter 25. The multipliers 11a2 and 11b2 on one input each receive output 24a from the loop filter 2. The respective other inputs of multipliers 11a1 and 11b2 recieve the vector H from the correlator 9. The respective other inputs of multipliers 11a2 and 11b1 recieve the vector J from the correlator 10.

Outputs of multipliers 11a1 and 11a2 are subtracted to form an input to the filter 12. Outputs of multipliers 11b1 and 11b2 are added to form an input to the filter 13.

Alternative embodiments of the invention are imaginable.

Figure 5:
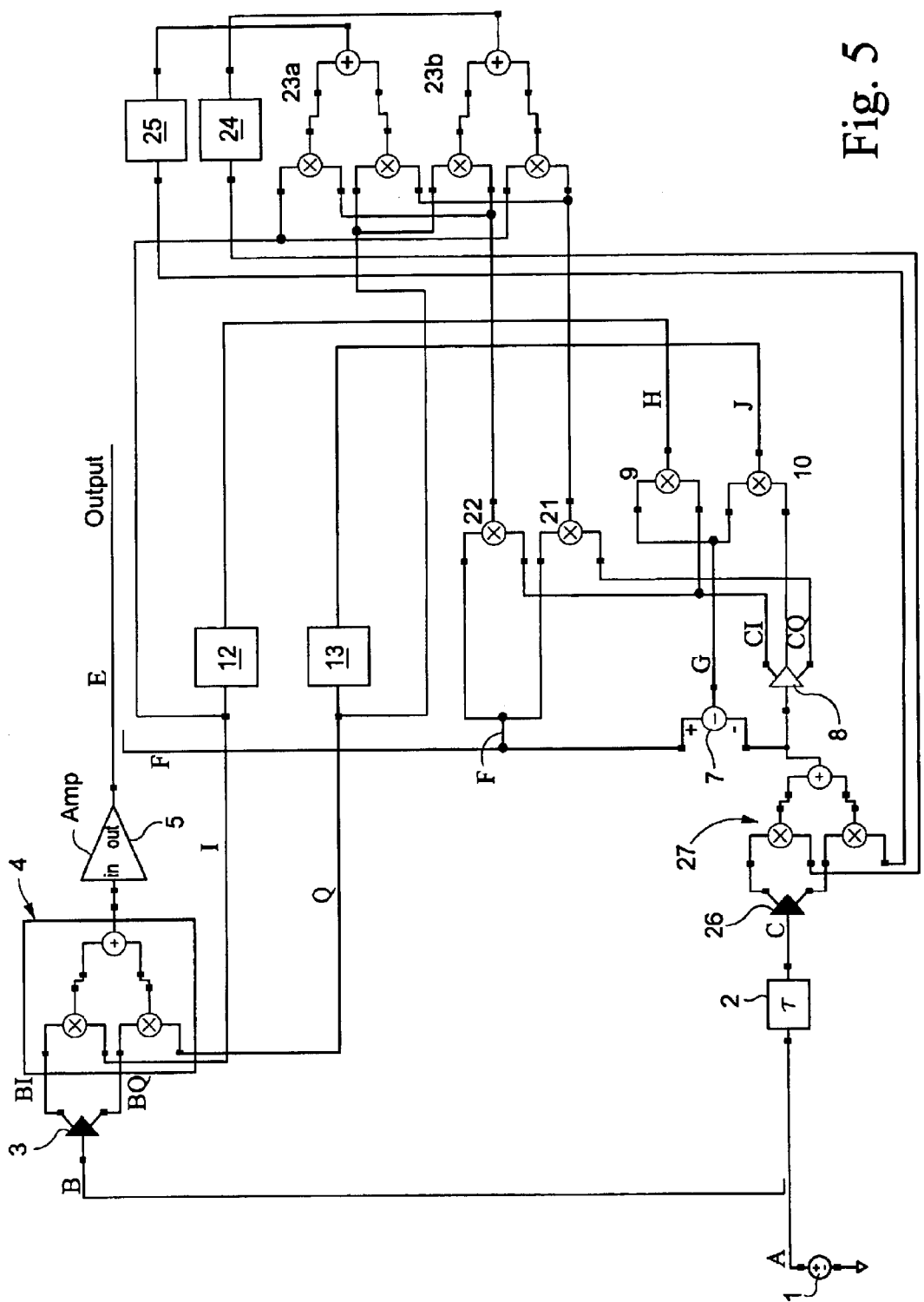
Figure 6:
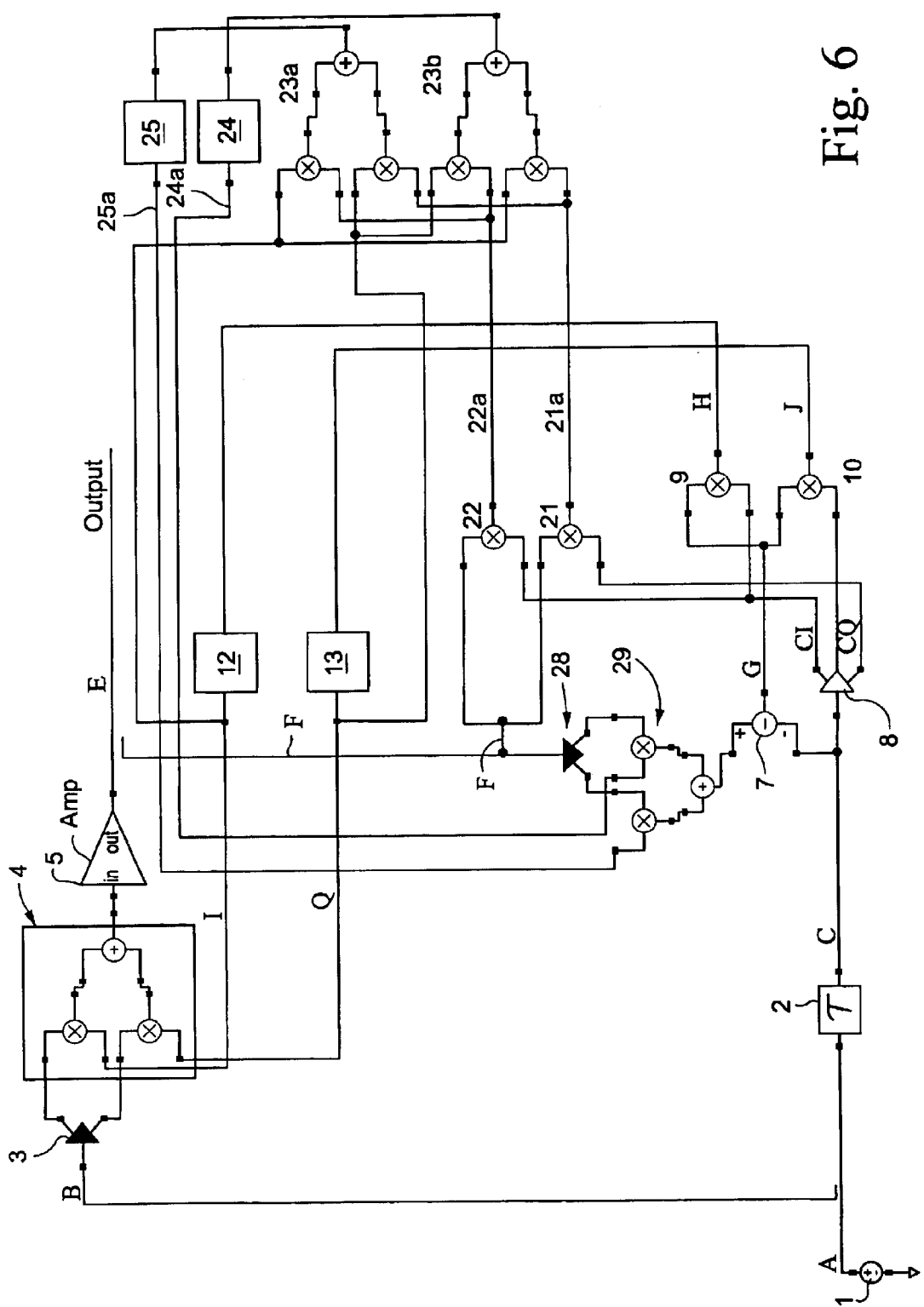
Figure 7:
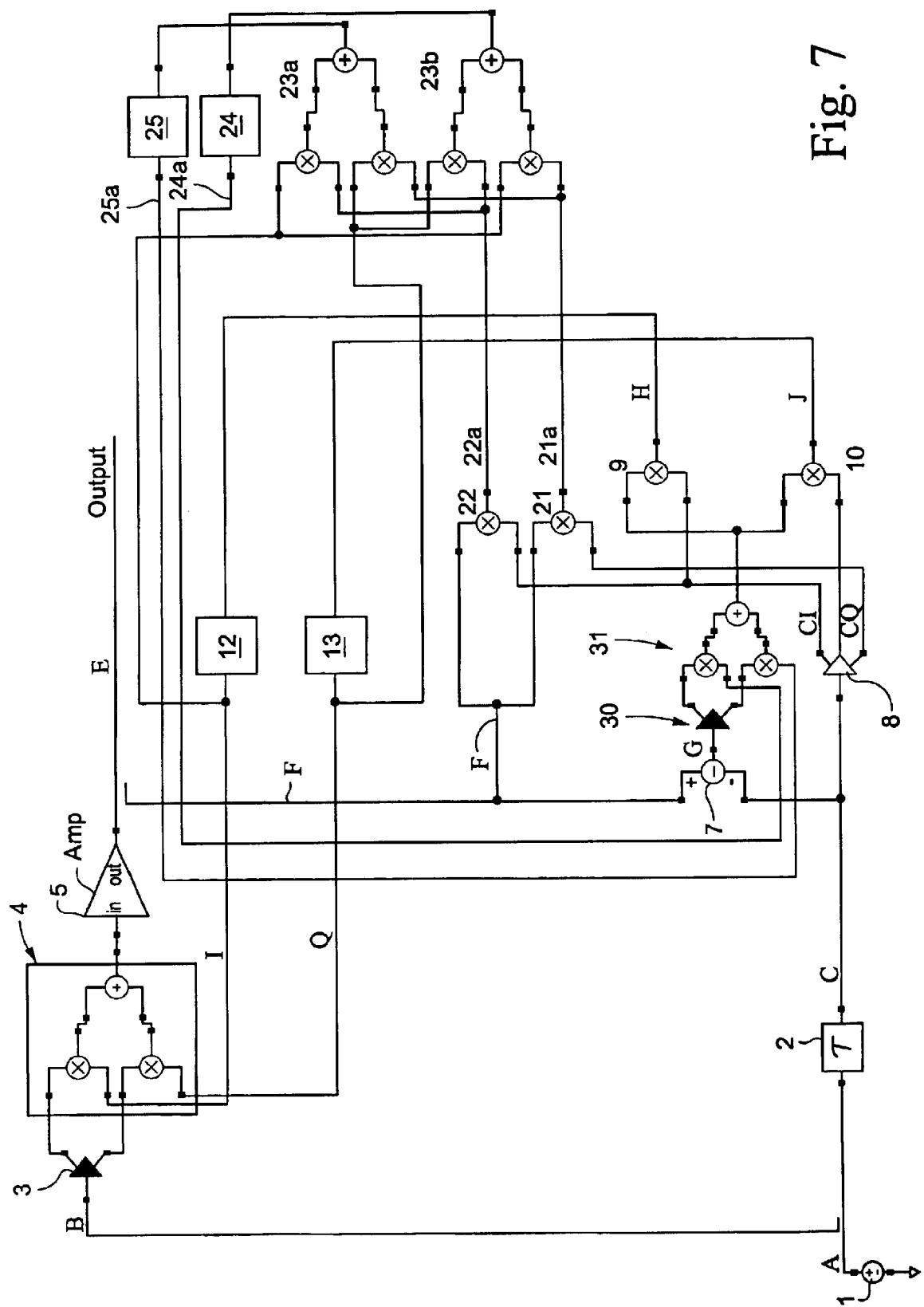

The phase measurement as well as the co-ordinate system rotation can be performed in several places in the system and FIG. 4 should be seen as one example. It as obvious, for example, that the co-ordinate system rotation can be made directly on the control signals Q and I, i.e. the rotator 11 may be located after the filters 12 and 13. Other examples are rotation on any of the RF signals involved, e.g. the reference signal C as illustrated in FIG. 5, the signal E from the main amplifier 5, the signal F from the main amplifier going to the summation point 7 as illustrated in FIG. 6, or the signal G forming the output of the summation point 7 as illustrated in FIG. 7. In the same manner the phase difference can be measured in various ways, directly or indirectly as illustrated above.

FIGS. 5–7 have in common that they lack the rotator 11 of FIG. 4 and that the the error vectors H and J proceed directly to filters 12 and 13, respectively. In the case of FIG. 5 signal C is splitted in a 90-degree phase splitter 26 into two orthogonal components used in a Cartesian phase and gain control element 27 as controlled by signals 24a and 25a from filters 24 and 25, respectively. The output of the control element 27 is received in the phase splitter 8. In the case of FIG. 6 signal F is splitted in a 90-degree phase splitter 28 into two orthogonal components used in a Cartesian phase and gain control element 29 as controlled by signals 24a and 25a from filters 24 and 25, respectively. The output of the control element 29 is received in the upper input of the subtracting circuit 7. In the case of FIG. 7 signal G is splitted in a 90-degree phase splitter 30 into two orthogonal components used in a Cartesian phase and gain control element 31 as controlled by signals 24a and 25a from filters 24 and 25, respectively. The output of the control element 31 is received in the common, upper inputs of the correlators 9 and 10 which produce the error vectors H and J received in filters 12 and 13, respectively.

The implementations illustrated in FIGS. 4–7 are used for obtaining gain and phase equality between the main amplifier path and the reference path. Thus any distortion produced by the main amplifier will be the result of the subtraction of signals F and C. This means that the control loop compensates for changes in the main amplifier loop.

From what is said above, it is obvious that the control loop can also be used to suppress distortion produced in the main amplifier loop since distortion can be seen as the result of signal-induced changes in the amplifier characteristics.

The embodiments described above serve merely as illustration and not as limitation. It will be apparent to one of ordinary skill in the art that departures may be made from the embodiments described above without departing from the spirit and scope of the invention. The invention should not be regarded as being limited to the examples described, but should be regarded instead as being equal in scope to the following claims.

What is claimed is:

1. A method for automatically controlling the phase in a linearised electronic amplifier forming a main amplifier path receiving a signal from a signal source and having a main output, comprising splitting said signal (1) from said signal source (A) into a main signal (B) going to said main amplifier path (3,4,5) and a reference signal (C), said main and reference signals (B,C) having a phase difference, phase splitting said main signal (B) into first orthogonal vector components (BI/BQ), and phase splitting said reference signal (C) into second orthogonal vector components (CI/CQ), said vector components forming part of a Cartesian system, characterised by measuring the phase difference between the main signal (B) and the reference signal (C), and stabilizing said Cartesian system by rotating said co-ordinates as controlled by the phase difference and thereby minimise the phase difference.

2. A method according to claim 1, characterised by receiving in a Cartesian phase and gain control element (4) in said main amplifier path (3,4,5) said first split signals (BQ,BI) and producing therefrom an outgoing phase of said main signal (B), determining by means of a Cartesian phase detector (21,22) a phase difference between the reference signal (C) and a signal (F) directed from the output of the main amplifier (5) to a summation point (7) for this signal (F) and the reference signal (C), performing said measuring on the phase difference between the outgoing phase (I,Q) at the Cartesian phase and gain control element (4) and the phase obtained with the Cartesian phase detector (21,22).

3. A method according to claim 1, characterised by receiving in a Cartesian phase and gain control element (4) in said main amplifier path (3,4,5) said first split signals (BI,BQ), and producing therefrom an outgoing phase of said main signal (B), producing control signals (I,Q) for controlling said Cartesian phase and gain control element (4), determining by means of a Cartesian phase detector (21, 22) a phase difference between the reference signal (C) and a signal (F) directed from the output of the main amplifier (5) to a summation point (7) for this signal (F) and the reference signal (C), and performing said measuring of said phase difference by measuring and subtracting the phase of said control signals (I,Q) and subtracting it from the phase obtained with the Cartesian phase detector (21,22).

4. A method according to claim 3, characterised by producing a difference signal (G) of the output signal from the main amplifier (5) and the reference signal (C), correlating said orthogonal vector (CI,CQ) and said difference signal (G) to produce error vectors (H,J) as input variables to said rotating means (11) for performing rotation thereon to produce said control signals (I,Q).

5. A method according to claim 1 characterised by performing the rotation on a radio frequency (RF) signal (E) in the main amplifier path (3,4,5).

6. A method according to claim 1 characterised by performing the rotation on the phase of the reference signal (C).

7. A method according to claim 6, characterised by phase splitting said reference signal into third orthogonal vector components, correlating said third orthogonal vector components to produce an input to said second phase splitting means (8).

8. A method according to claim 2, characterised by performing performing the rotation on said signal (F) directed from the output of the main amplifier to a summation point (7) for this signal and said reference signal.

9. A method according to claim 8, characterised by phase splitting said reference signal (F) directed from the output of the main amplifier into fourth orthogonal vector components, correlating said fourth orthogonal vector components to produce an input to said summation point (7).

10. A method according to claim 4, characterised by performing the rotation on an error signal (G) providing the difference between the amplifier's output signal (E) and the reference signal (C).

11. A method according to claim 10, characterised by phase splitting said error signal (G) into fifth orthogonal vector components, correlating said fifth orthogonal vector components to produce an input to said correlating means (9,10) for receiving and correlating said second orthogonal vectors and said difference signal (G) to produce error vectors.

12. A system for automatically controlling the phase in a linearised electronic amplifier (3,4,5) forming a main amplifier path receiving a signal (A) from a signal source (1) and having a main output (E), comprising signal splitting means (A1) for splitting said signal (1) from said signal source (A) into a main signal (B) going to said main amplifier path (3,4,5) and a reference signal (C), said main and reference signals (B,C) having a phase difference, first phase splitting means (3) for phase splitting said main signal (B) into first orthogonal vector components (BI/BQ), and second phase splitting means (8) for phase splitting said reference signal (C) into second orthogonal vector components (CI/CQ), said vector components forming part of a Cartesian system, characterised by means (21,22,23) for measuring the phase difference between the main signal (B) and the reference signal (C), and rotating means (11; 27; 29; 31) for stabilizing said Cartesian system by rotating said co-ordinates as controlled by the phase difference and thereby minimise the phase difference.

13. A system according to claim 12, characterised by a Cartesian phase and gain control element (4) in said main amplifier path (3,4,5) for receiving said first split signals (BQ,BI) and producing therefrom an outgoing phase of said main signal (B), a Cartesian phase detector (21,22) for determining a phase difference between the reference signal (C) and a signal (F) directed from the output of the main amplifier (5) to a summation point (7) for this signal (F) and the reference signal (C), means (23) for performing said measuring on the phase difference between the outgoing phase (I,Q)) at the Cartesian phase and gain control element (4) and the phase obtained with the Cartesian phase detector (21, 22).

14. A system according to claim 12, characterised by a Cartesian phase and gain control element (4) in said main amplifier path (3,4,5) for receiving said first split signals (BI,BQ), and producing therefrom an outgoing phase of said main signal (B), means (9,10,11,12,13) for producing control signals (I,Q) for controlling said Cartesian phase and gain control element (4), a Cartesian phase detector (21, 22) for determining a phase difference between the reference signal (C) and a signal (F) directed from the output of the main amplifier (5) to a summation point (7) for this signal (F) and the reference signal (C), and means for performing said measuring of said phase difference by measuring and subtracting the phase of said control signals (I,Q) and subtracting it from the phase obtained with the Cartesian phase detector (21,22).

15. A system according to claim 14, characterised by means (7) for producing a difference signal (G) of the outout signal from the main amplifier (5) and the reference signal (C), correlating means (9,10) for receiving and correlating said orthogonal vector (CI,CQ) and said difference signal (G) to produce error vectors (H,J) as input variables to said rotating means (11) for performing rotation thereon to produce said control signals (I,Q).

16. A system according to claim 12 characterised in that said rotating means (11) perform the rotation on a radio frequency (RF) signal (E) in the main amplifier path (3,4,5).

17. A system according to claim 1 characterised in that said rotating means perform the rotation on the phase of the reference signal (C).

18. A system according to claim 17, characterized by third phase splitting means (26) for phase splitting said reference signal (C) into third orthogonal vector components, correlating means (27) for receiving and correlating said third orthogonal vector components to produce an input to said second phase splitting means (8).

19. A system according to claim 12, characterised in that said rotating means performs the rotation on said signal (F) directed from the output of the main amplifier to a summation point (7) for this signal and said reference signal.

20. A system according to claim 19, characterised by fourth phase splitting means (28) for phase splitting said reference signal (F) directed from the output of the main amplifier into fourth orthogonal vector components, correlating means (29) for receiving and correlating said fourth orthogonal vector components to produce an input to said summation point (7).

21. A system according to claim 15, characterised in that said rotating means perform the rotation on an error signal (G) providing the difference between the amplifier's output signal (E) and the reference signal (C).

22. A system according to claim 21, characterised by fifth phase splitting means (30) for phase splitting said error signal (G) into fifth orthogonal vector components, fifth correlating means (31) for receiving and correlating said fifth orthogonal vector components to produce an input to said correlating means (9, 10) for receiving and correlating said second orthogonal vectors and said difference signal G to produce error vectors.

* * * * *